(12) United States Patent
Yang et al.

(10) Patent No.: US 9,494,630 B2
(45) Date of Patent: Nov. 15, 2016

(54) METHOD AND SYSTEM FOR ADJUSTING ELECTRIC FIELD INTENSITY

(71) Applicants: BEIJING LENOVO SOFTWARE LTD, Beijing (CN); LENOVO (BEIJING) CO., LTD, Beijing (CN)

(72) Inventors: Guang Yang, Beijing (CN); Qi Li, Beijing (CN)

(73) Assignees: Beijing Lenovo Software Ltd., Beijing (CN); Lenovo (Beijing) Co., Ltd., Beijing (CN)

( * ) Notice: Subject to any disclaimer, the term of this patent is extended or adjusted under 35 U.S.C. 154(b) by 0 days.

(21) Appl. No.: 14/348,256

(22) PCT Filed: Jul. 11, 2013

(86) PCT No.: PCT/CN2013/079237
§ 371 (c)(1),
(2) Date: Mar. 28, 2014

(87) PCT Pub. No.: WO2014/019444
PCT Pub. Date: Feb. 6, 2014

(65) Prior Publication Data
US 2015/0137832 A1    May 21, 2015

(30) Foreign Application Priority Data

Jul. 30, 2012  (CN) .......................... 2012 1 0268867
Sep. 17, 2012  (CN) .......................... 2012 1 0345544

(51) Int. Cl.
*G01R 27/26* (2006.01)
*H01G 5/16* (2006.01)
*G01D 5/24* (2006.01)

(52) U.S. Cl.
CPC ............. *G01R 27/2605* (2013.01); *G01D 5/24* (2013.01); *H01G 5/16* (2013.01)

(58) Field of Classification Search
CPC .... G01R 27/26; G01R 27/22; G01R 27/221; G01R 27/00; G01D 5/24; H01G 5/16
See application file for complete search history.

(56) References Cited

U.S. PATENT DOCUMENTS 7,012,567 B2   3/2006   Osaka et al.
9,019,226 B2   4/2015   Karpin et al.
(Continued)

FOREIGN PATENT DOCUMENTS

CN   1673937 A     9/2005
CN   101140158 A   3/2008
(Continued)

OTHER PUBLICATIONS

International Search Report (in Chinese with English translation) and Written Opinion (in Chinese) for PCT/CN2013/079237, mailed Oct. 17, 2013; ISA/CN.

(Continued)

*Primary Examiner* — Son Le
(74) *Attorney, Agent, or Firm* — Harness, Dickey & Pierce, P.L.C.

(57) ABSTRACT

The present application provides a method for adjusting an electric field intensity, comprising: when detecting that a probe capacitance threshold generated by a capacitor plate group reaches a preset critical value, changing relative positions of or a connection relationship between capacitor plates in the capacitor plate group, and adjusting an electric field intensity generated by the capacitor plate group. By using the method for adjusting an electric field intensity of the present application, when an electric field intensity generated by a capacitor plate group cannot cover an object to be detected, the electric field intensity generated by the capacitor plate group is increased by changing relative positions of or a connection relationship between capacitor plates, so that the electric field intensity generated by the capacitor plate group can continue to cover the object to be detected.

17 Claims, 14 Drawing Sheets

(56) References Cited

U.S. PATENT DOCUMENTS

| | | |
|---|---|---|
| 2005/0206565 A1 | 9/2005 | Osaka et al. |
| 2011/0096025 A1* | 4/2011 | Slobodin ................. G06F 3/044 345/174 |
| 2012/0025850 A1* | 2/2012 | Yamaguchi ............ B60N 2/002 324/679 |
| 2012/0044199 A1 | 2/2012 | Karpin et al. |
| 2014/0002406 A1* | 1/2014 | Cormier, Jr. ............ G06F 3/044 345/174 |
| 2014/0035871 A1 | 2/2014 | Karpin et al. |

FOREIGN PATENT DOCUMENTS

| | | |
|---|---|---|
| CN | 101315834 A | 12/2008 |
| CN | 101608928 A | 12/2009 |
| CN | 102297884 A | 12/2011 |
| CN | 102427357 A | 4/2012 |
| CN | 102576276 A | 7/2012 |
| WO | 2013/082838 A1 | 6/2013 |

OTHER PUBLICATIONS

Chinese Office Action dated Feb. 2, 2015 for Chinese application 201210345544.2. English translation provided by Espace.

First Chinese Office Action regarding Application No. 201210268867.6 dated Dec. 2, 2015. English translation provided by http://globaldossier.uspto.gov.

* cited by examiner

METHOD AND SYSTEM FOR ADJUSTING ELECTRIC FIELD INTENSITY

CROSS-REFERENCE TO RELATED APPLICATIONS

This application is the national phase of International Application No. PCT/CN2013/079237, titled "METHOD AND SYSTEM FOR ADJUSTING ELECTRIC FIELD INTENSITY", filed on Feb. 6, 2014, which claims priority to Chinese patent application No. 201210268867.6, titled "APPARATUS AND ELECTRONIC DEVICE FOR NON-CONTACT INPUT" and filed with the State Intellectual Property Office on Jul. 30, 2012, and priority to Chinese patent application No. 201210345544.2, titled "METHOD AND SYSTEM FOR ADJUSTING ELECTRIC FIELD INTENSITY" and filed with the State Intellectual Property Office on Sep. 17, 2012, which are incorporated herein by reference in their entirety.

FIELD

The present invention relates to electric field detection, and in particular, to a method for adjusting an intensity of an electric filed and a system thereof.

BACKGROUND

Due to the floating capacitive sensing, 3D input is available for a next generation of touch technology. Once a detection object is within the coverage of an electric field generated by a capacitor plate, the distance between the detection object and the capacitor plate is detected.

Conventionally, due to the fixed arrangement of the group of capacitor plates, the intensity of the electric field generated by the group is fixed. That is, the coverage of the generated electric field is limited, and accordingly, distance detection can not be performed effectively in the case that the detection object locates beyond the coverage of the electric field.

Furthermore, in a conventional non-contact input apparatus applying the floating capacitive sensing technology, for a capacitor screen with a fixed area, as the area of a touch-positioning unit increases, the number of the touch-positioning units decreases. Hence, the accuracy of the non-contact input apparatus in detecting the operation location sharply decreases.

SUMMARY

A method for enhancing an intensity of an electric field is provided in the disclosure, which may adjust the intensity of the electric field generated by a capacitor plate, and improve the detection accuracy for a detection object.

A system for adjusting an intensity of an electric field is further provided in the disclosure, to implement and apply the above method in practice.

To solve the above problem, a method for adjusting an intensity of an electric field is provided in the disclosure. The method includes:

detecting that a capacitance threshold of a sensing capacitor generated by a group of capacitor plates reaches a preset critical value;

changing a relative position or connection of capacitor plates in the group of capacitor plates; and adjusting the intensity of the electric field generated by the group of capacitor plates.

In the method, optionally, the detecting that the capacitance threshold of the sensing capacitor generated by the group of capacitor plates reaches the preset critical value includes:

determining a vector direction in which a detection object locates with respect to the group of capacitor plates; and in the case the detection object is beyond coverage of the sensing capacitor generated in the vector direction by the group of capacitor plates, determining that the capacitance threshold of the sensing capacitor generated by the group of capacitor plates reaches the preset critical value.

In the method, optionally, the changing the relative position of the capacitor plates in the group of capacitor plates includes:

changing a whole shape of the group of capacitor plates to make the group of capacitor plates form a curvature in the vector direction.

In the method, optionally, before performing the method, the method further includes:

pre-arranging at least two groups of capacitor plates, where maximum capacitances of the sensing capacitors generated by the groups of capacitor plates are different from each other.

The method, optionally, further includes:

when detecting that the capacitance threshold of the sensing capacitor generated by the current group of capacitor plates with respect to the detection object reaches the preset critical value, switching from the current group of capacitor plates to a first group of capacitor plates; where the maximum capacitance of the sensing capacitor generated by the first group of capacitor plates is larger than the maximum capacitance of the sensing capacitor generated by the current group of capacitor plates.

In the method, optionally, the changing the connection of the capacitor plates in the group of capacitor plates includes:

selecting at least two capacitor plates from the group of capacitor plates; and correlating the selected capacitor plates to form a second group of capacitor plates;

where the detection object is within the coverage of the sensing capacitor generated in the vector direction by the second group of capacitor plates.

A system for adjusting an intensity of an electric field is provided. The system includes:

a detection unit, adapted to detect whether a capacitance threshold of a sensing capacitor generated by a group of capacitor plates reaches a preset critical value; and an adjustment unit, adapted to, in the case that the detection unit detects that the capacitance threshold of the sensing capacitor generated by the group of capacitor plates reaches the preset critical value, change a relative position or connection of capacitor plates in the group of capacitor plates, to adjust the intensity of the electric field generated by the group of capacitor plates.

In the system, optionally, the detection unit includes:

a determination sub-unit, adapted to determine a vector direction in which a detection object locates with respect to the group of capacitor plates; and a judgment sub-unit, adapted to, in the case that the detection object is beyond coverage of the sensing capacitor generated in the vector direction by the group of capacitor plates, judge that the capacitance threshold of the sensing capacitor generated by the group of capacitor plates reaches the preset critical value.

In the system, optionally, the adjustment unit includes:

a first adjustment sub-unit, adapted to change a whole shape of the group of capacitor plates to make the group of capacitor plates form a curvature in the vector direction.

In the system, optionally, the adjustment unit includes:

a second adjustment sub-unit, adapted to select at least two capacitor plates from the group of capacitor plates, and correlate the selected capacitor plates to form a second group of capacitor plates, where the detection object is within the coverage of the sensing capacitor generated in the vector direction by the second group of capacitor plates.

In the system, optionally, the capacitor plates are arranged in two layers with a gap between the two layers of capacitor plates; each layer of the two layers of capacitor plates includes a plurality of touch-positioning units; and the touch-positioning units on one layer of capacitor plate(s) are distributed staggeredly with respect to the touch-positioning units on the other layer of capacitor plate(s).

Optionally, the touch-positioning units on one layer of capacitor plate(s) are distributed staggeredly with respect to the touch-positioning units on the other layer of capacitor plate(s) in a way that:

one layer in the two layers of capacitor plates includes a first capacitor plate and the other layer includes a second capacitor plate;

a distribution of the touch-positioning units on the first capacitor plate is same as a distribution of the touch-positioning units on the second capacitor plate; and the second capacitor plate is staggered, in a first direction, from the first capacitor plate with a first distance, and is staggered, in a second direction, from the first capacitor plate with a second distance, where the first direction is perpendicular to the second direction.

Optionally, the first distance equals to the second distance.

Optionally, the first distance is shorter than a length of one touch-positioning unit in the first direction, and the second distance is shorter than a length of one touch-positioning unit in the second direction.

Optionally, the touch-positioning units are rhombic or rectangular.

Optionally, an isolation layer is arranged between the two layers of capacitor plates.

Optionally, a protection layer is arranged above the two layers of capacitor plates.

Optionally, the capacitor plate further includes a third capacitor plate, and there is a gap between the second and third capacitor plates.

A distribution of the touch-positioning units of the third capacitor plate is same as the distributions of the touch-positioning units on the first capacitor plate and the second capacitor plate.

The third capacitor plate is staggered, in the first direction, from the second capacitor plate with the first distance, and the third capacitor plate is staggered, in the second direction, from the second capacitor plate with the second distance, where the first direction is perpendicular to the second direction.

Optionally, the first distance equals to the second distance.

Compared with the existing technologies, the present application has the following advantages.

The method for adjusting the intensity of the intensity of the electric field is provided in the disclosure. The method includes: when detecting a capacitance threshold of a sensing capacitor generated by a group of capacitor plates reaches a preset critical value, changing relative positions of capacitor plates in the group of capacitor plates or changing connection relationships between capacitor plates in the group of capacitor plates, to adjust the intensity of the electric field generated by the group of capacitor plates. With the method for adjusting the intensity of the electric field provided in the disclosure, in the case that the detection object is beyond coverage of the sensing capacitor generated in the vector direction by the group of capacitor plates, the intensity of the electric field generated by the group of capacitor plates is increased by changing the relative positions of the capacitor plates or changing the connection relationships between capacitor plates, so that the intensity of the electric field generated by the group of capacitor plates can continue getting the detection object in coverage, and accordingly, the detection accuracy for the detection object is improved.

DETAILED DESCRIPTION OF THE EMBODIMENTS

Technical solutions according to embodiments of the disclosure are described clearly and completely hereinafter in conjunction with drawings to be used in the embodiments of the disclosure. Obviously, described embodiments are merely part of, rather than all of the embodiments of the disclosure. Any other embodiment obtained based on the embodiments of the disclosure by those skilled in the art without creative works should fall in the scope of protection of the disclosure.

The disclosure may be applied to various general or dedicated computing apparatus environments or configurations, for example, personal computer, server computer, handheld device or portable device, panel device, multiprocessor apparatus, distributed computing environment including any of the above apparatuses or devices, etc.

Figure 1:
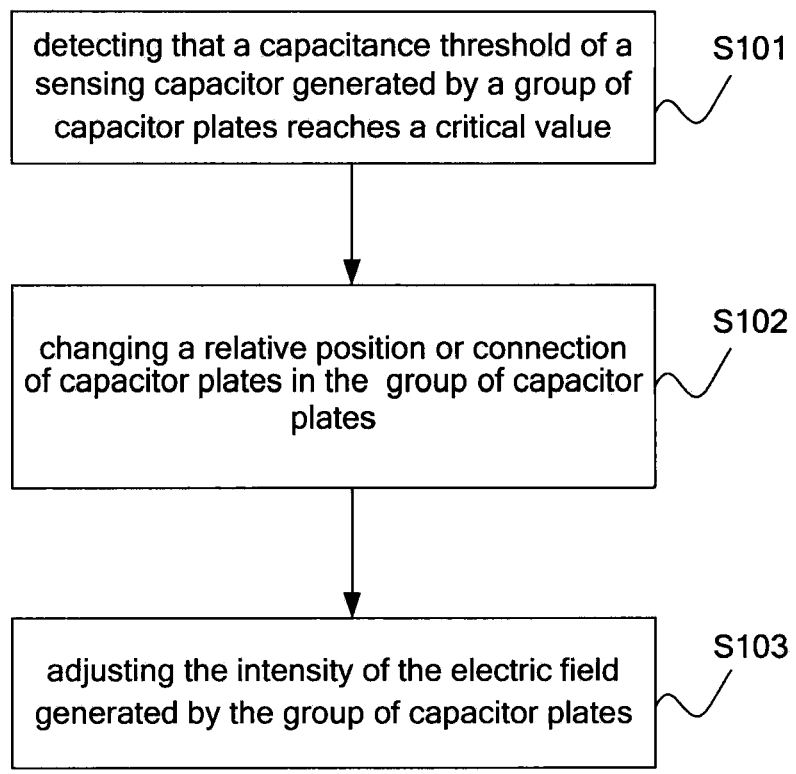
FIG. 1 is a flowchart of a first example of a method for adjusting an intensity of an electric field provided in the disclosure.

FIG. 1 illustrates a flowchart of a method for adjusting an intensity of an electric field provided in the disclosure. The method for adjusting the intensity of the electric field includes steps S101 to S103.

In the step 101, if it is detected that a capacitance threshold of a sensing capacitor generated by a group of capacitor plates reaches a critical value, the procedure proceeds to the step S102.

When the electric field generated by the group of capacitor plates is utilized to get a detection object in coverage to detect a distance between the detection object and the group of capacitor plates, if the detection object locates far from the group of capacitor plates and is beyond the coverage of the group of capacitor plates, the detection of the distance between the detection object and the group of capacitor plates may not be accomplished very well.

Figure 2:
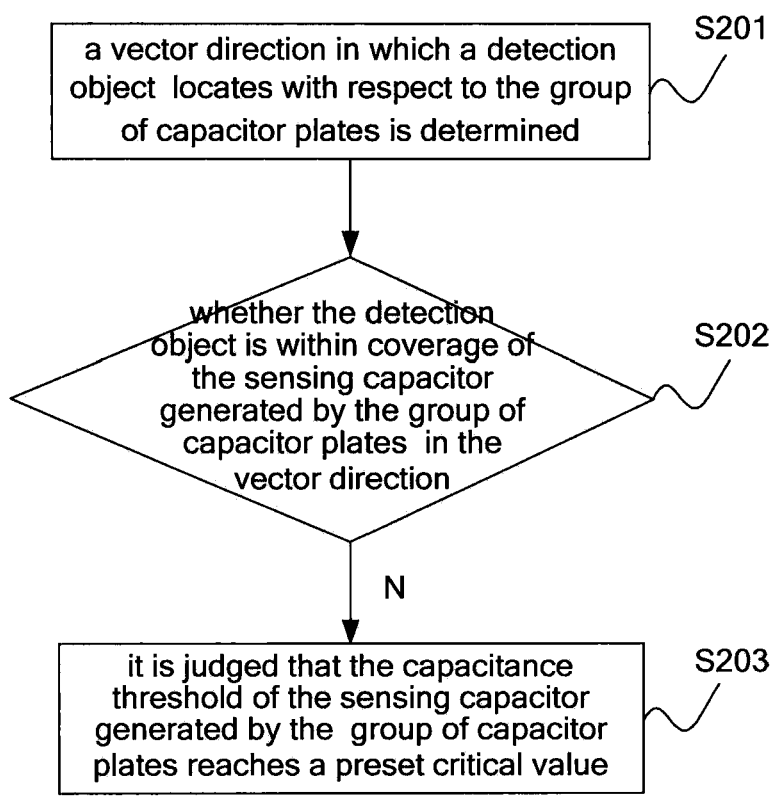
FIG. 2 is another flowchart of the first example of the method for adjusting the intensity of the electric field provided in the disclosure.

An approach for detecting whether a capacitance threshold of a sensing capacitor generated by a group of capacitor plates reaches a critical value is provided in the disclosure, and a procedure of the approach is illustrated as FIG. 2. The procedure includes steps S201 to S203.

In the step S201, a vector direction in which a detection object locates with respect to the group of capacitor plates is determined.

In the step S202, it is judged whether the detection object is within a coverage of the sensing capacitor generated in the vector direction by the group of capacitor plates, and the procedure proceeds to the step S203 if the detection object is beyond the coverage of the sensing capacitor in the vector direction.

In the step S203, it is judged that the capacitance threshold of the sensing capacitor generated by the group of capacitor plates reaches a preset critical value.

In the case that the sensing capacitor generated by the group of capacitor plates is utilized to get the detection object in coverage, due to reasons such as location and arrangement direction of the group of capacitor plates, etc., in a vector direction where the detection object locates with respect to the group of capacitor plates, the sensing capacitor generated by the group of capacitor plates may not reach a maximum capacitance that the group of capacitor plates can generate. In the case that the capacitance threshold of the sensing capacitor generated in the vector direction by the group of capacitor plates reaches the critical value, that is, in the case that the detection object is not in coverage, the procedure proceeds to the step S102.

In the step S102, relative positions of capacitor plates in the group of capacitor plates or connection relationships between the capacitor plates in the group of capacitor plates are changed.

In the case that the detection object is beyond coverage of the sensing capacitor generated in the vector direction by the group of capacitor plates, the capacitance generated by the group of capacitor plates may be increased by changing the relative positions of the capacitor plates in the group of capacitor plates or the connection relationships between the capacitor plates in the group of capacitor plates.

The changing the relative positions of the capacitor plates in the group of capacitor plates includes:

changing a whole shape of the group of capacitor plates to make the group of capacitor plates form a curvature in the vector direction.

A whole capacitor plate formed by the capacitor plates in the group of capacitor plates is concaved downward with the curvature. Here, the capacitance threshold of the sensing capacitor generated by the group of capacitor plates with the curvature is larger than the capacitance threshold of the sensing capacitor generated by the initial group of capacitor plates.

Implementation of changing the relative positions of the capacitor plates in the group of capacitor plates is described hereinafter according to an embodiment of the disclosure.

Figure 5:
FIG. 5 is a first schematic diagram of a third example of a method for adjusting an intensity of an electric field provided in the disclosure.
Figure 6:
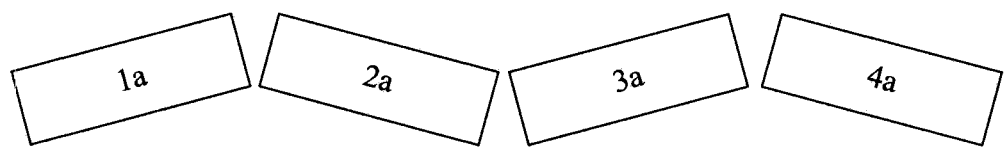
FIG. 6 is a second schematic diagram of the third embodiment of the method for adjusting the intensity of the electric field provided in the disclosure.

FIG. 5 illustrates a group of capacitor plates. Referring to FIG. 5, the group of capacitor plates includes capacitor plates 1a, 2a, 3a and 4a. In the case that the detection object is beyond coverage of the sensing capacitor generated by the group of capacitor plates, relative positions of respective capacitor plates are changed. A whole shape of the group of capacitor plates after the changing of the positions is shown in FIG. 6, where the capacitor plates 2a and 3a form a curvature concaved downward. Because of the curvature, the capacitance threshold of the sensing capacitor generated, in a vector direction with respect to the detection object, by the group of capacitor plates with a changed whole shape is larger than the capacitance threshold of the sensing capacitor generated by the initial group of capacitor plates.

Figure 3:
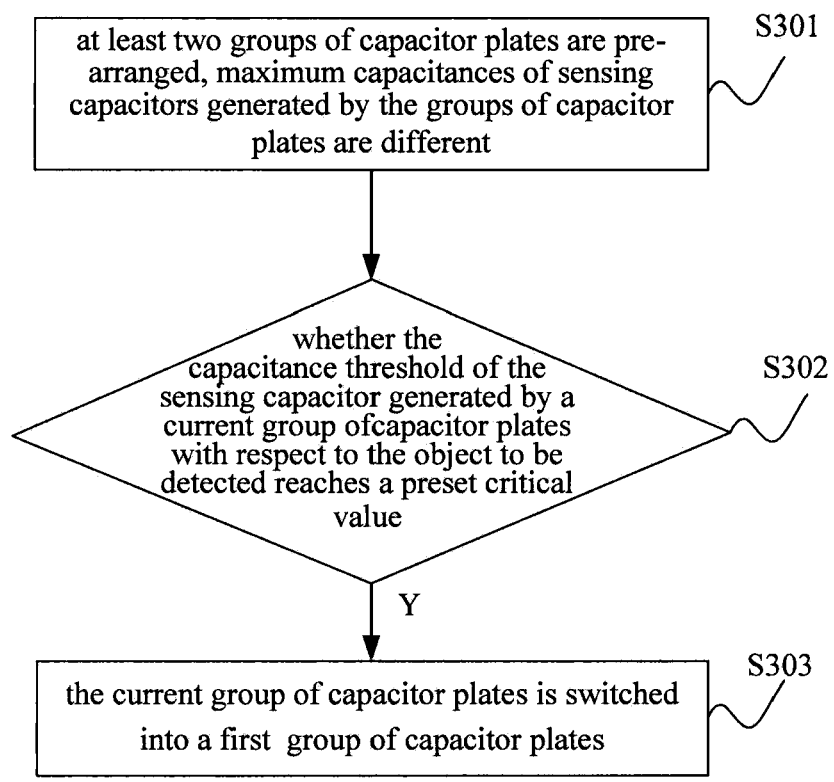
FIG. 3 is a flowchart of a second example of a method for adjusting an intensity of an electric field provided in the disclosure.

Another example of a method for adjusting the intensity of the electric field is provided in terms of changing the relative positions of the capacitor plates. As shown in FIG. 3 provided in an embodiment of the disclosure, the method for adjusting the intensity of the electric field includes steps S301 to S303.

In the step S301, at least two groups of capacitor plates are pre-arranged. Maximum capacitances of sensing capacitors generated by the groups of capacitor plates are different.

In the step S302, it is judged whether the capacitance threshold of the sensing capacitor generated by a current group of capacitor plates with respect to the detection object reaches a preset critical value, and the procedure proceeds to the step S303 if the capacitance threshold of the sensing capacitor reaches the preset critical value.

In the step S303, a switch from the current group of capacitor plates to a first group of capacitor plates is performed. The maximum capacitance of the sensor capacitor generated by the first group of capacitor plates is larger than the maximum capacitance of the sensing capacitor generated by the current group of capacitor plates.

Figure 7:
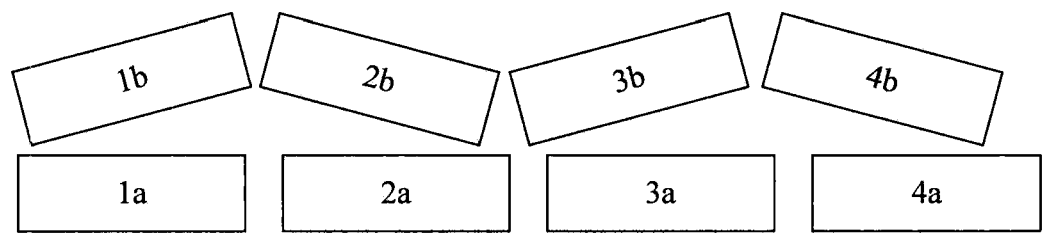
FIG. 7 is a third schematic diagram of the third embodiment of the method for adjusting the intensity of the electric field provided in the disclosure.

Referring to FIG. 7, two groups of capacitor plates are arranged.

Capacitor plates 1a, 2a, 3a and 4a form the current group of capacitor plates, generating the sensing capacitor having an electric field to get the detection object in coverage.

Capacitor plates 1b, 2b, 3b and 4b form the first group of capacitor plates. In the case that the current group of capacitor plates generates the sensing capacitor to get the detection object in coverage of the electric field, the first group of capacitor plates is a standby group of capacitor plates and does not generate any sensing capacitor. While in the case that the capacitance threshold of the sensing capacitor generated by the current group of capacitor plates reaches the preset critical value and the detection object can not continue being in coverage, the current group of capacitor plates is stopped from generating the sensing capacitor and the first group of capacitor plates is initiated to generate the sensing capacitor to get the detection object in coverage of the electric field.

As shown in FIG. 7, in the first group of capacitor plates, the capacitors 2b and 3b form a curvature concaved downward. Capacitance inductance between the capacitor plates is increased because of the curvature. Hence, an intensity of the electric field generated by the whole group of capacitor plates is increased.

Figure 4:
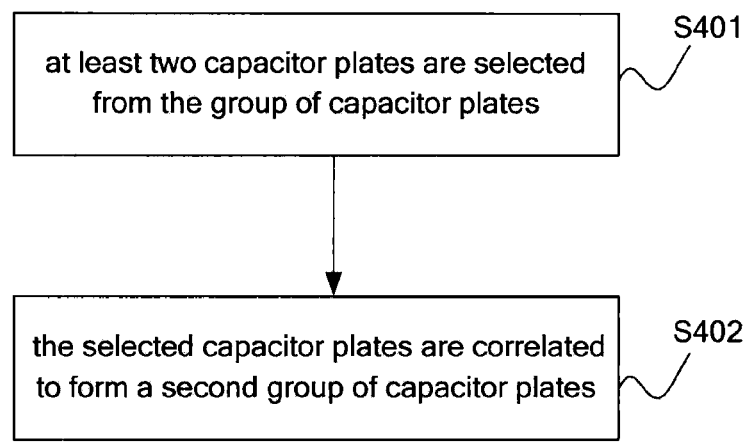
FIG. 4 is another flowchart of the first example of the method for adjusting the intensity of the electric field provided the present application.

As shown in FIG. 4 according to an embodiment of the disclosure, changing the connection relationships between the capacitor plates in the group of capacitor plates includes steps S401 to S402.

In the step S401, at least two capacitor plates are selected from the group of capacitor plates.

In the step S402, the selected capacitor plates are correlated to form a second group of capacitor plates. The detection object is within the coverage of the sensing capacitor generated in the vector direction by the second group of capacitor plates.

Figure 8:
FIG. 8 is a first schematic diagram of a fourth embodiment of a method for adjusting an intensity of an electric field provided in the disclosure.
Figure 8:

Referring to FIG. 8 according to an embodiment of the disclosure, capacitor plates 1c, 2c, 3c and 4c form a group of capacitor plates, generating a sensing capacitor to get a detection object A in coverage of an electric field. In the case that the capacitance threshold of the sensing capacitor generated by the group of capacitor plates reaches a preset critical value and can not get the detection object in coverage, connection relationships between capacitor plates 1c, 2c, 3c and 4c are changed.

Figure 9:
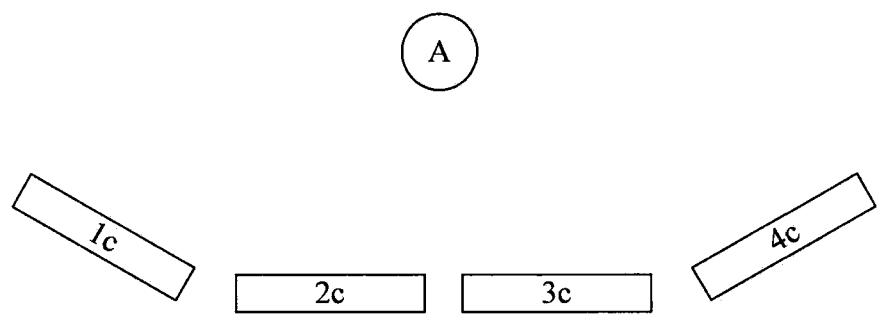
FIG. 9 is a second schematic diagram of the fourth embodiment of the method for adjusting the intensity of the electric field provided in the disclosure.

One approach for changing the connection relationships may be referred to FIG. 9. As shown in FIG. 9, the connection relationships between the capacitor plates are changed to form a new group of capacitor plates with a curvature concaved downward. The principle is consistent with the implementation of changing the relative positions of the capacitor plates.

Figure 10:
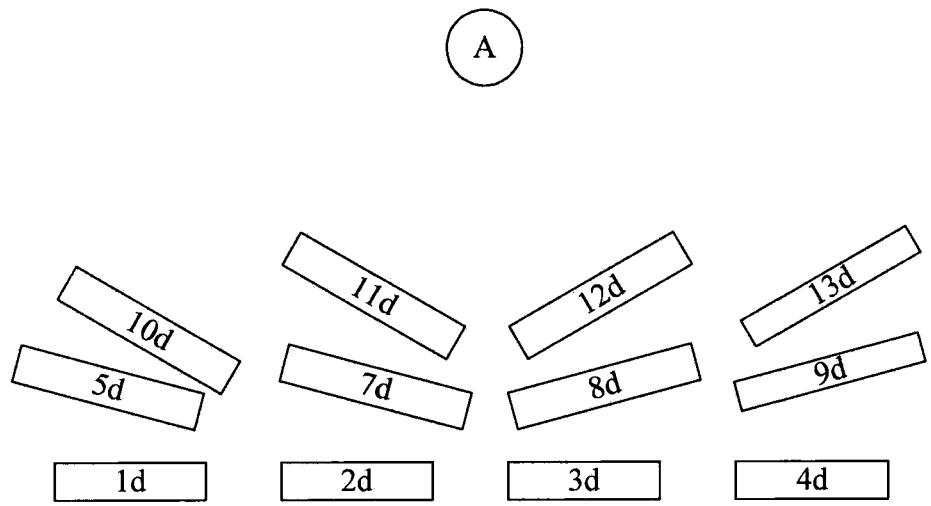
FIG. 10 is a third schematic diagram of the fourth embodiment of the method for adjusting the intensity of the electric field provided in the disclosure.

Another implementation may be referred to FIG. 10. Multiple capacitor plates may be placed for different detection objects. As shown in FIG. 10, capacitor plates 1d to 13d are placed at different locations. For example, for a detection object A, capacitor plates 1d, 2d, 3d and 4d are selected to form a group of capacitor plates "a" to generate a sensing capacitor to get the detection object A in coverage of an electric field.

In the case that the detection object is replaced with a detection object A1, the detection object A1 is far from the group of capacitor plates a formed by the capacitor plates 1d, 2d, 3d and 4d, and the sensing capacitor generated by the group of capacitor plates a can not get the detection object A1 in coverage, capacitor plates are re-selected. For example, capacitor plates 10d, 7d, 8d and 13d are selected to form a second group of capacitor plates to get the detection object A1 in coverage of the electric field.

In the step S103, the intensity of the electric field generated by the group of capacitor plates is adjusted.

The intensity of the electric field generated by the group of capacitor plates may be adjusted with the above implementations. Accordingly, the detection object may be sensed better, a higher sensing accuracy is obtained, and the distance is detected precisely.

Figure 11:
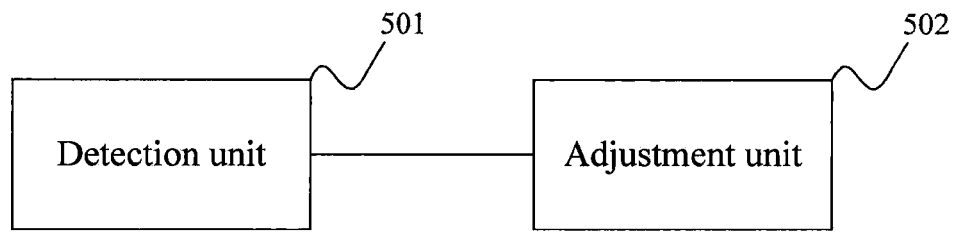
FIG. 11 is a schematic structural diagram of a first example of a system for adjusting an intensity of an electric field provided in the disclosure.

Corresponding to the method for adjusting the intensity of the electric field shown in FIG. 1, a system for adjusting an intensity of an electric field is further provided in the disclosure. Referring to FIG. 11, the system includes:

a detection unit 501 and an adjustment unit 502;

where, the detection unit 501 is adapted to detect whether a capacitance threshold of a sensing capacitor generated by a group of capacitor plates reaches a preset critical value; and the adjustment unit 502 is adapted to, in the case that the capacitance threshold of the sensing capacitor generated by the detection unit 501 reaches the preset critical value, change relative positions of capacitor plates in the group of capacitor plates or connection relationships between capacitor plates in the group of capacitor plates, to adjust an intensity of an electric filed generated by the group of capacitor plates.

Figure 12:
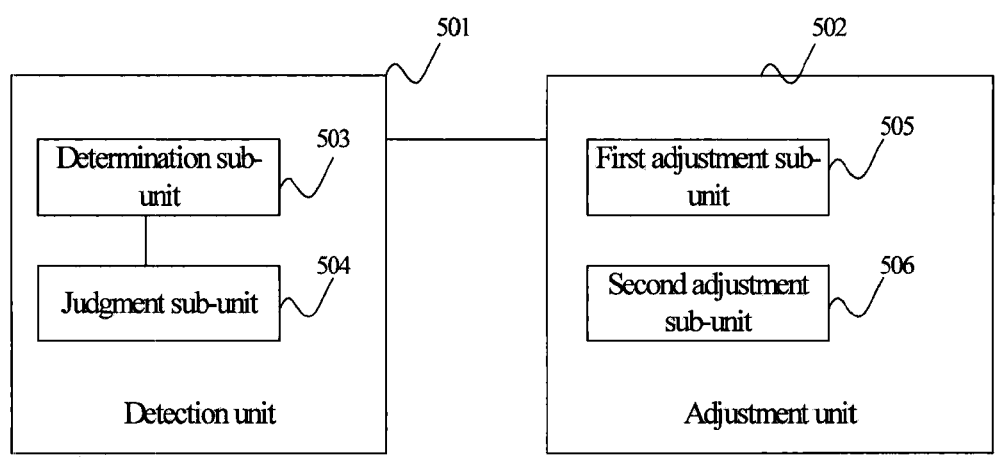
FIG. 12 is a schematic structural diagram of a second example of a system for adjusting an intensity of an electric field provided in the disclosure.

Based on FIG. 11, a second example of a system for adjusting the intensity of the electric field is provided in the disclosure. FIG. 12 illustrates a schematic structural diagram of the system for adjusting the intensity of the electric field. As shown in FIG. 12, the system includes a detection unit 501 and an adjustment unit 501.

The detection unit 501 includes:

a determination sub-unit 503 and a judgment sub-unit 504.

The determination sub-unit 503 is adapted to determine a vector direction in which a detection object locates with respect to a group of capacitor plates.

The judgment sub-unit 504 is adapted to, in the case that the detection object is beyond coverage of the sensing capacitor generated in the vector direction by the group of capacitor plates, judge that the capacitance threshold of the sensing capacitor generated by the group of capacitor plates reaches a preset critical value.

The adjustment unit 502 includes a first adjustment sub-unit 505 and a second adjustment sub-unit 506.

The first adjustment sub-unit 505 is adapted to change a whole shape of the group of capacitor plates to make the group of capacitor plates form a curvature in the vector direction.

The second adjustment sub-unit 506 is adapted to select at least two capacitor plates from the group of capacitor plates and correlate the selected capacitor plates to form a second group of capacitor plates. The detection object is within the coverage of the sensing capacitor generated in the vector direction by the second group of capacitor plates.

In a system for adjusting an intensity of an electric field according to an embodiment of the disclosure, the capacitor plates are arranged in two layers with a gap between the two layers of capacitor plates. There are multiple touch-positioning units on both of the two layers of capacitor plates. The touch-positioning units on one layer of capacitor plate(s) are staggeredly distributed with respect to the touch-positioning units on the other layer of capacitor plate(s).

Figure 13:
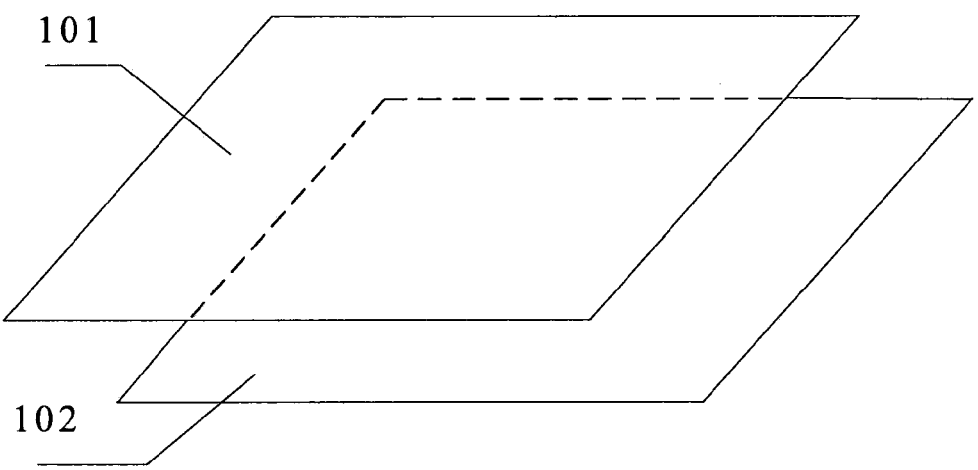
FIG. 13 is a schematic structural diagram of a first example of capacitor plates in a system for adjusting an intensity of an electric field provided in the disclosure.

FIG. 13 is a schematic diagram of a first example of capacitor plates in a system for adjusting an intensity of an electric field provided in the disclosure. As shown in FIG. 13, an apparatus at least includes capacitor plates 101 and 102. There is a gap between the capacitor plates 101 and 102. It should be noted that, there may be multiple touch-positioning units (not shown in FIG. 13) on both the capacitor plates 101 and 102. The touch-positioning units may have various shapes, for example, the touch-positioning units may be rhombic, square, etc.

Figure 14:
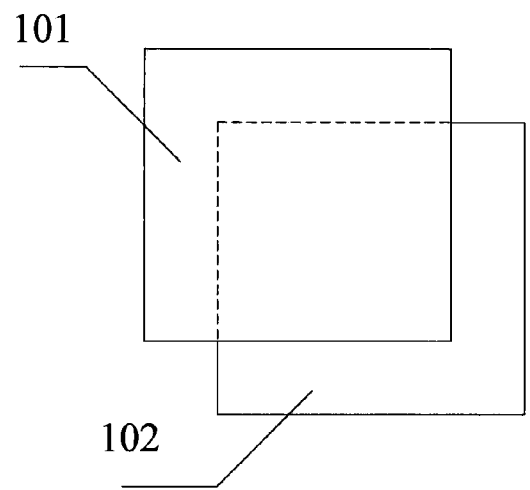
FIG. 14 is a top view of the first example of the capacitor plates in the system for adjusting the intensity of the electric field provided in the disclosure.

FIG. 14 is a top view of the first example of the capacitor plates in the system for adjusting the intensity of the electric field provided in the disclosure. As shown in FIG. 14, the capacitor plates 101 and 102 are staggeredly arranged.

A principle of the example is described hereinafter in detail.

Firstly, as a non-contact input apparatus, the area of the touch-positioning unit on the apparatus needs to be large enough. The larger the area of the capacitor plate is, the farther the capacitor plate senses, and then the non-contact capacitive sensing input can be achieved. However, the total area of the capacitor plate is fixed, in the case that the area of a single touch-positioning unit increases, the number of the touch-positioning units on the capacitor plate may decrease, and accordingly, a positioning accuracy of the capacitor plate is decreased.

If a new layer of capacitor plate is added under the original capacitor plate, the two capacitor plates may not affect each other in the capacitive sensing input. Moreover, the positioning accuracy of the non-contact input apparatus may be improved in the case that the two layers of the capacitor plates are staggeredly arranged.

Figure 15:
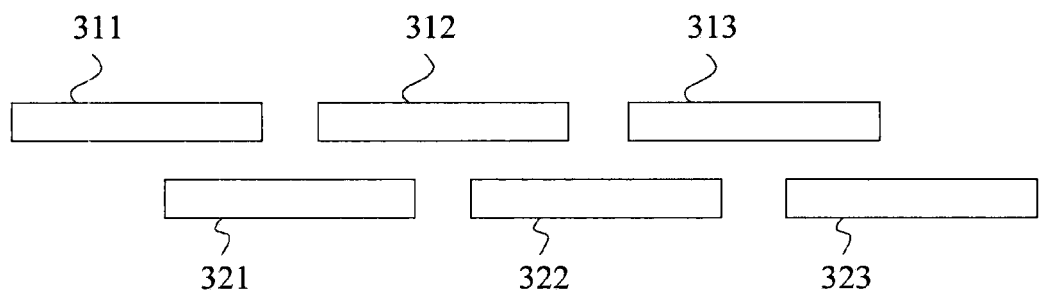
FIG. 15 is a diagram showing a mode for a staggered distribution of touch-positioning units on the first example of the capacitor plates in the system for adjusting the intensity of the electric field provided in the disclosure.

FIG. 15 is a schematic diagram showing a mode for the staggered distribution of the touch-positioning units on the capacitor plates in the system for adjusting the intensity of the electric field provided in the first example of the capacitor plates in the disclosure. In FIG. 15, touch-positioning units 311, 312 and 313 are the touch-positioning units on an upper layer of capacitor plate(s). Touch-positioning units 321, 322 and 323 are the touch-positioning units on a lower layer of capacitor plate(s). The touch-positioning units on the upper and lower layers are staggeredly distributed. As shown in FIG. 3, a midpoint of the touch-positioning unit 321 locates between the touch-positioning units 311 and 312, and the midpoint of the touch-positioning unit 322 locates between the touch-positioning units 312 and 313. According to a simple capacitive sensing approach, a position of a touch-positioning unit sensing a largest capacitance among the touch-positioning units is regarded as the position where a non-contact input is performed. In the case that there is only one layer of capacitor plate(s), a region shown in FIG. 3 may only be divided into three small touch regions, that is, only the non-contact input performed on the touch-positioning unit 311,312 or 313 can be sensed. In the case that two layers of capacitor plates are staggeredly arranged as shown in FIG. 3, if the non-contact input is performed between the touch-positioning units 311 and 312, the non-contact input may be sensed by the touch-positioning unit 321.

Therefore, the capacitor plates in the system for adjusting the intensity of the electric field according to this embodiment is applied to sense the non-contact operation, and the sensing accuracy of the position of the operation is improved.

Figure 16:
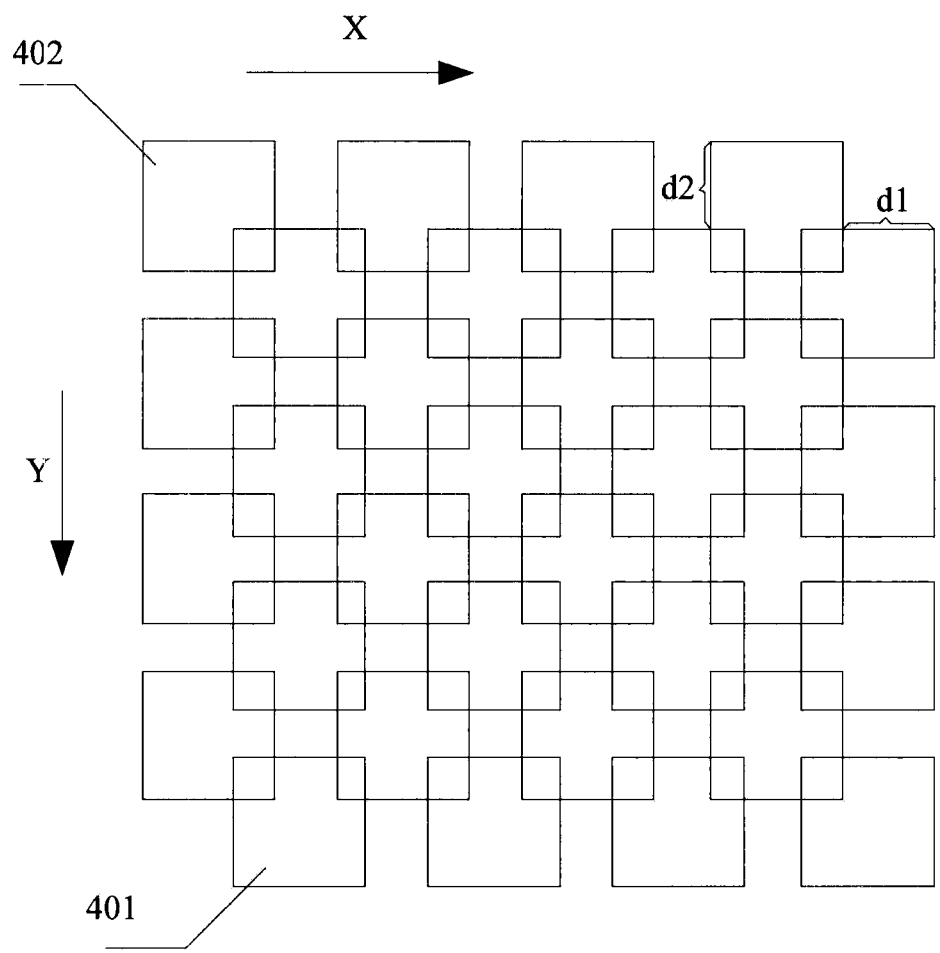
FIG. 16 is a schematic diagram of a second example of capacitor plates in a system for adjusting an intensity of an electric field provided in the disclosure.

FIG. 16 is a schematic diagram of a second example of capacitor plates in a system for adjusting an intensity of an electric field provided in the disclosure. Touch-positioning units on capacitor plates 401 and 402 are rectangular. Connection lines between the touch-positioning units on the capacitor plates are not shown in FIG. 4. In the example, a distribution of the touch-positioning units on the capacitor plate 401 is same as that of the touch-positioning units on the capacitor 402. The capacitor plate 401 locates above the capacitor 402 and is arranged staggeredly with respect to the capacitor plate 402. As shown in FIG. 16, the capacitor plate 401 is staggered, in an X direction, from the capacitor plate 402 with a first distance d1, and is staggered, in a Y direction, form the capacitor plate 402 with a second distance d2. The X direction is perpendicular to the Y direction. Usually, d1 equals to d2.

Figure 17:
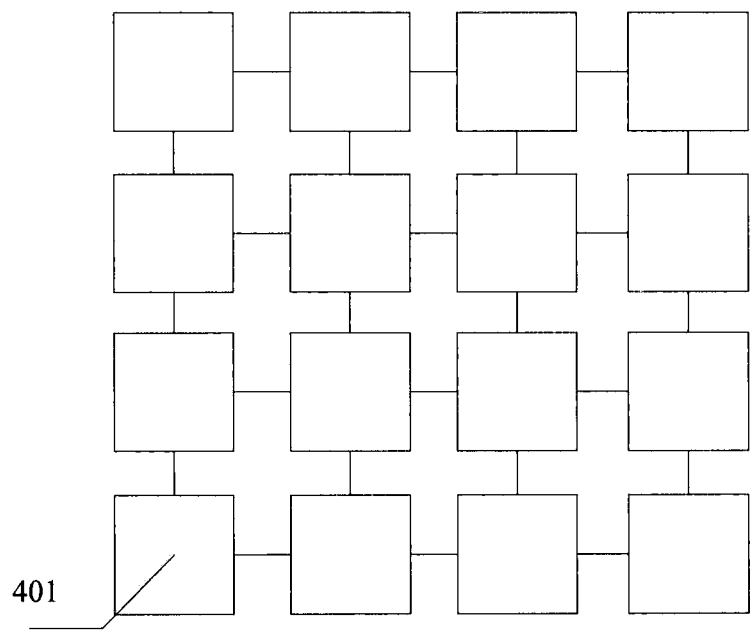
FIG. 17 is a schematic diagram of a third example of a capacitor plate in a system for adjusting an intensity of an electric field provided in the disclosure.

FIG. 17 is a schematic diagram of a third example of a capacitor plate in a system for adjusting an intensity of an electric field provided in the disclosure. Connection lines between touch-positioning units on a capacitor plate 401 are shown in FIG. 17.

In practice, in the case that two layers of capacitor plates are staggeredly arranged, usually, the first distance is shorter than a length of one touch-positioning unit in a first direction, and the second distance is shorter than the length of one touch-positioning unit in a second direction.

Figure 18:
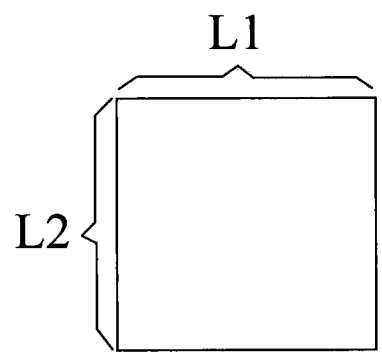
FIG. 18 is a diagram showing lengths of a rectangular touch-positioning unit in the third example of the capacitor plate in the system for adjusting the intensity of the electric field provided in the disclosure.

FIG. 18 is a diagram showing lengths of a rectangular touch-positioning unit on the third example of the capacitor plate in the system for adjusting an intensity of an electric field provided in the disclosure. In FIG. 18, the length of the touch-positioning unit in the first direction is L1, and the length of the touch-positioning unit in the second direction is L2. In this situation, the first distance d1, with which the second capacitor plate is staggered in the first direction from the first capacitor plate, may be shorter than L1, and the second distance d2, with which the first capacitor plate is staggered in the second direction from the first capacitor plate, may be shorter than L2.

Figure 19:
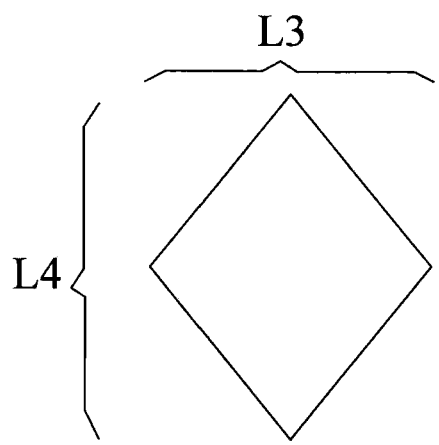
FIG. 19 is a diagram showing lengths of a rhombic touch-positioning unit in the third example of the capacitor plate in the system for adjusting the intensity of the electric field provided in the disclosure.

FIG. 19 is a diagram showing lengths of a rhombic touch-positioning unit on the third example of the capacitor plate in the system for adjusting the intensity of the electric field provided in the disclosure. In FIG. 19, the length of the touch-positioning unit in the first direction is L3, and the length of the touch-positioning unit in the second direction is L4. In this situation, the first distance d1, with which the first capacitor plate is staggered, in the first direction, from the first capacitor plate, may be shorter than L3, and the second distance d2, with which the first capacitor is staggered, in the second direction, from the first capacitor, may be shorter than L4.

Figure 20:
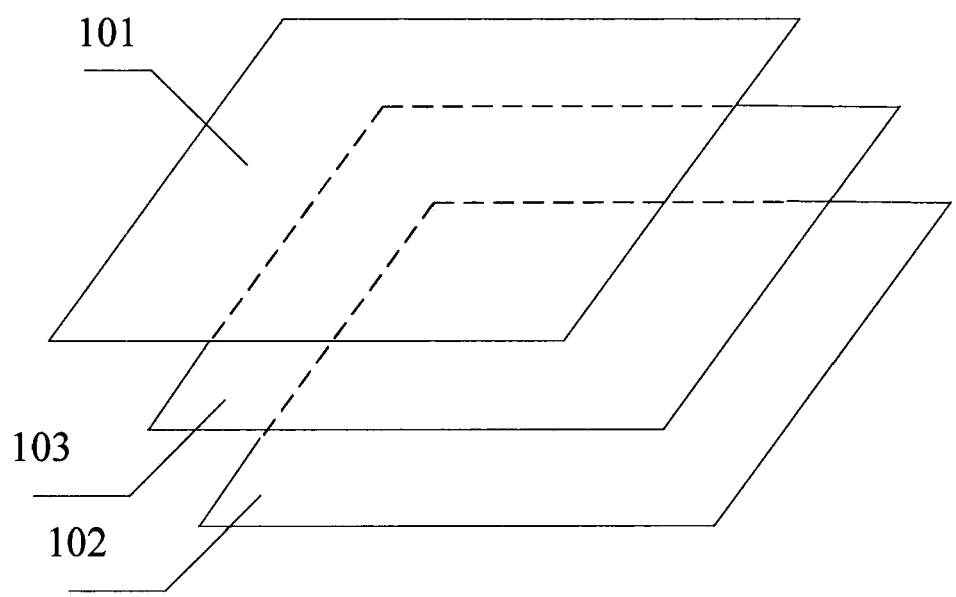
FIG. 20 is a schematic diagram of a fourth example of capacitor plates in a system for adjusting an intensity of an electric field provided in the disclosure.

FIG. 20 is a schematic diagram of a fourth example of capacitor plates in a system for adjusting an intensity of an electric field provided in the disclosure. As shown in FIG. 8, an apparatus at least includes capacitor plates 101 and 102. In FIG. 20, an isolation layer 103 is arranged between the capacitor plates 101 and 102 to prevent the capacitor plate 101 from contacting with the capacitor plate 102, and accordingly, the stability of the non-contact input apparatus provided in the disclosure is improved.

Figure 21:
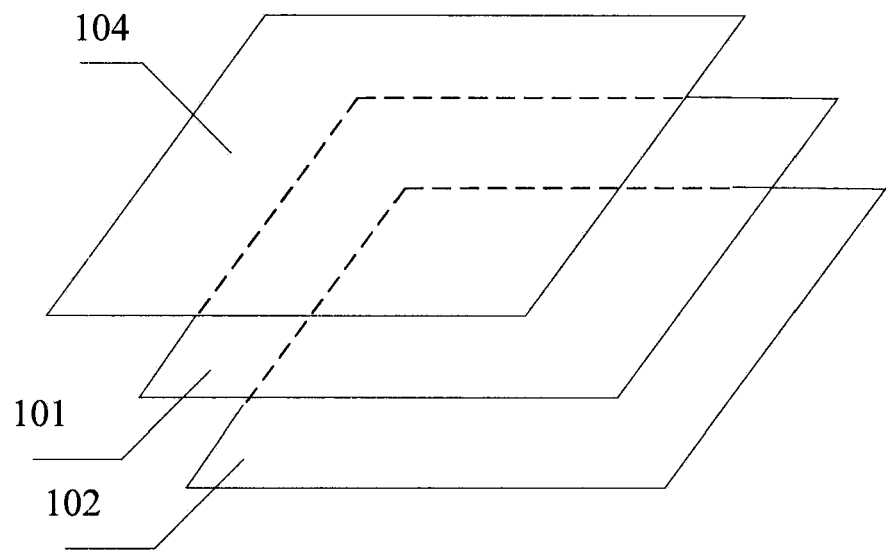
FIG. 21 is a schematic diagram of a fifth example of capacitor plates in a system for adjusting an intensity of an electric field provided in the disclosure.

FIG. 21 is a schematic diagram of a fifth example of capacitor plates in a system for adjusting an intensity of an electric field provided in the disclosure. As shown in FIG. 21, an apparatus at least includes capacitor plates 101 and 102. In FIG. 9, a protection layer 104 is arranged above the capacitor plate 101 to prevent the capacitor plate 101 from being scratched by other objects.

Figure 22:
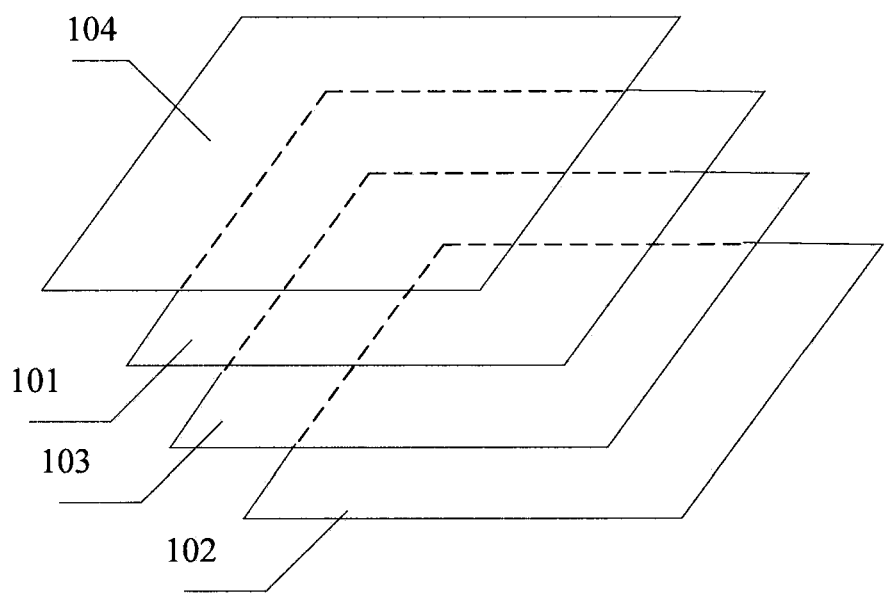
FIG. 22 is a schematic diagram of a sixth example of capacitor plates in a system for adjusting an intensity of an electric field provided in the disclosure.

A sixth example may be obtained based on the fourth and fifth examples of the capacitor plates in the system for adjusting an intensity of an electric field provided in the disclosure. FIG. 22 is a schematic diagram of the sixth example of the capacitor plates in the system for adjusting the intensity of the electric field provided in the disclosure. As shown in FIG. 22, in the system, there are at least capacitor plates 101 and 102. As shown in FIG. 9, a protection layer 104 is arranged above the capacitor plate 101, and an isolation layer 103 is provided between the capacitor plates 101 and 102.

Figure 23:
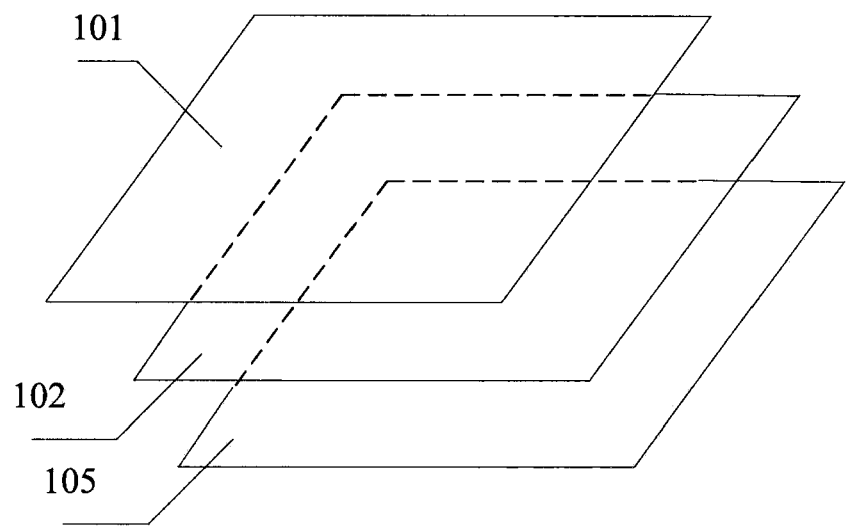
FIG. 23 is a schematic diagram of a seventh example of capacitor plates in a system for adjusting an intensity of an electric field provided in the disclosure.

FIG. 23 is a schematic diagram of a seventh example of capacitor plates in a system for adjusting an intensity of an electric field provided in the disclosure. As shown in FIG. 23, a structure of the capacitor plates in the system further includes a capacitor plate 105, and there is a gap between the capacitor plates 105 and 102.

A distribution of touch-positioning units on the capacitor plate 105 is same as the distributions of touch-positioning units on the capacitor plates 101 and 102.

The capacitor plate 105 is staggered, in a first direction, from the capacitor plate 102 with a first distance, and the capacitor plate 105 is staggered, in a second direction, from the capacitor plate 102 with a second distance. The first direction is perpendicular to the second direction. Usually, the first distance equals to the second distance.

In this example, since the capacitor plate 105 is added and is staggeredly arranged with respect to the capacitor plate 102, the positioning accuracy of non-contact input in the system is further improved.

Figure 24:
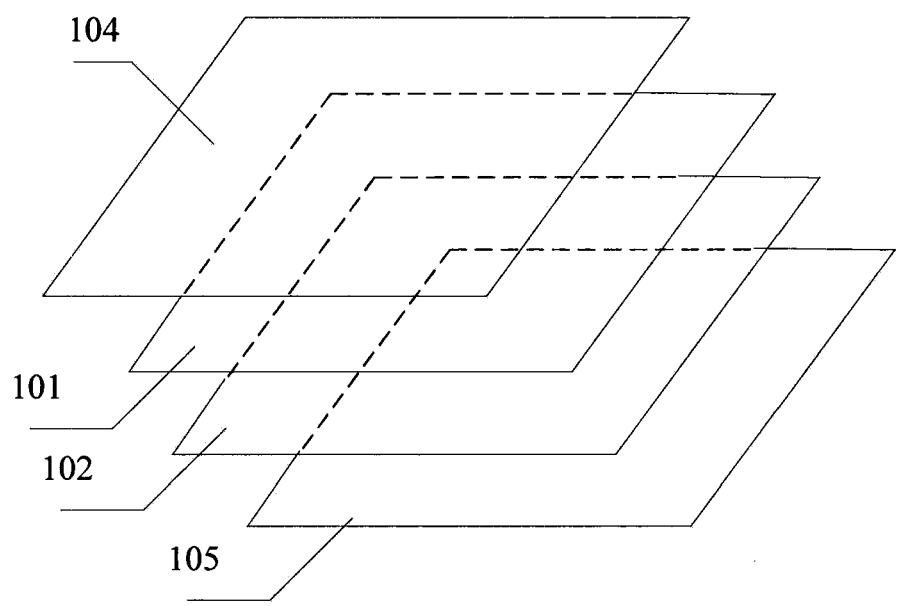
FIG. 24 is a schematic diagram of an eighth example of capacitor plates in a system for adjusting an intensity of an electric field provided in the disclosure.

FIG. 24 is a schematic diagram of an eighth example of capacitor plates in a system for adjusting an intensity of an electric field provided in the disclosure. As shown in FIG. 24, an apparatus includes capacitor plates 101, 102 and 105. In FIG. 24, a protection layer 104 is arranged above the capacitor plate 101 to prevent the capacitor plate 101 from being scratched by other objects.

Figure 25:
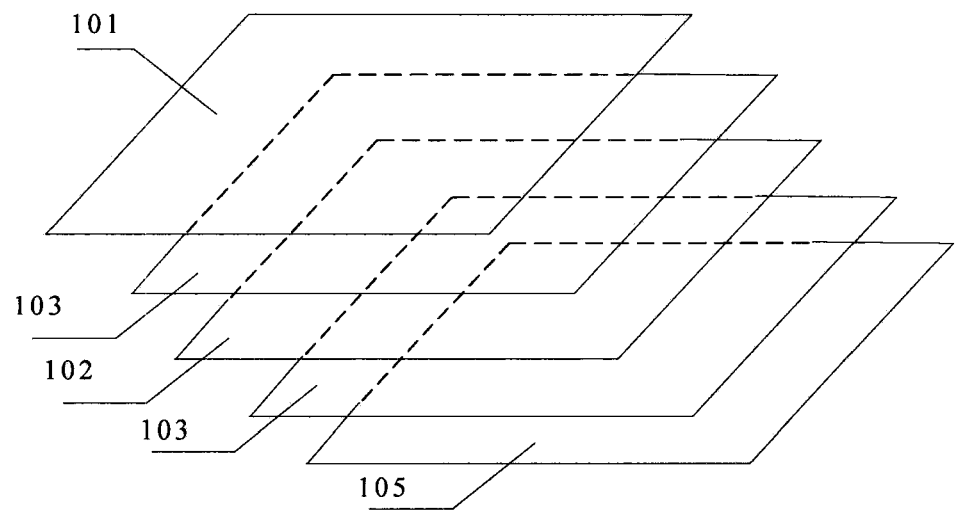
FIG. 25 is a schematic diagram of a ninth example of capacitor plates in a system for adjusting an intensity of an electric field provided in the disclosure.

FIG. 25 is a schematic diagram of a ninth embodiment of capacitor plates in a system for adjusting an intensity of an electric field provided in the disclosure. As shown in FIG. 25, an apparatus includes capacitor plates 101, 102 and 105. Isolation layers 103 are arranged both between the capacitor plates 101 and 102 and between the capacitor plates 102 and 105 to prevent neighboring capacitor plates from contacting with each other, and accordingly, the stability of non-contact input in the system is improved.

Figure 26:
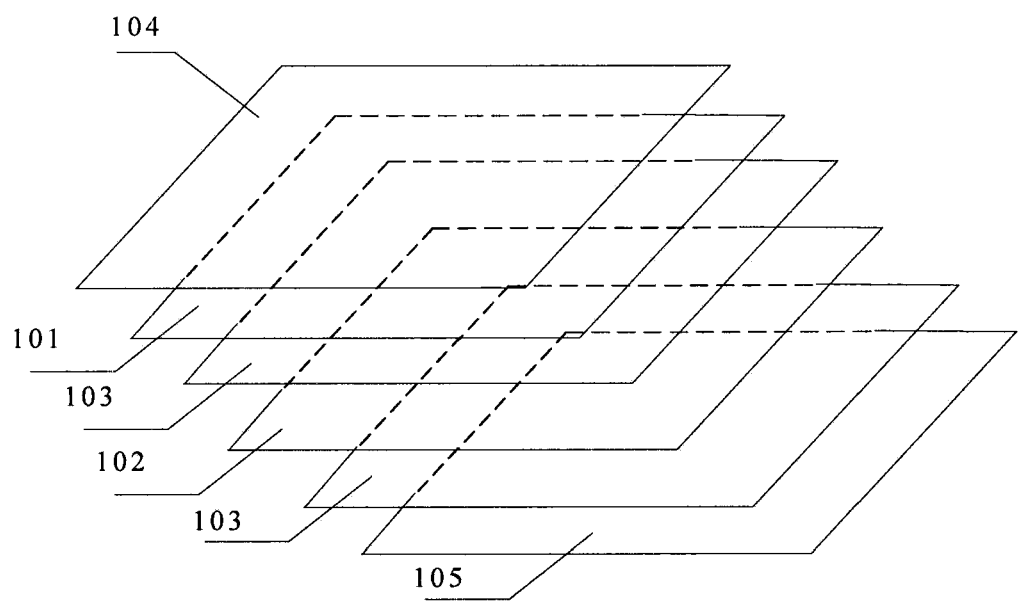
FIG. 26 is a schematic diagram of a tenth example of capacitor plates in a system for adjusting an intensity of an electric field provided in the disclosure.

FIG. 26 is a schematic diagram of a tenth example of capacitor plates in a system for adjusting an intensity of an electric field provided in the disclosure. As shown in FIG. 26, an apparatus includes capacitor plates 101, 102 and 105. Isolation layers 103 are arranged both between the capacitor plates 101 and 102 and between the capacitor plates 102 and 105. A protection layer 104 is arranged above the capacitor plate 101.

It can be seen that, for the non-contact input of the system, the more the staggeredly arranged capacitor plates are, the more precise a positioning performance is. In addition, the isolation layers may be arranged between any two neighboring layers of capacitor plates, the protection layer may be arranged above an outermost layer of capacitor plate(s).

A non-contact input apparatus is provided in the disclosure. A structure of the apparatus may be referred to FIG. 13. The apparatus at least includes capacitor plates 101 and 102. As shown in FIG. 13, there is a certain gap between the capacitor plates 101 and 102. It should be noted that, there may be multiple touch-positioning units (not shown in FIG. 13) on both the capacitor plates 101 and 102. The touch-positioning unit may have various shapes, for example, the touch-positioning units may be rhombic, square, etc.

A top-view of a first example of the non-contact input apparatus provided in the disclosure may be referred to FIG. 14. As shown in FIG. 14, the capacitor plates 101 and 102 are staggeredly arranged.

A principle of the example is described hereinafter in detail.

Firstly, as a non-contact input apparatus, area of the touch-positioning unit on the apparatus needs to be large enough. The larger an area of the capacitor plate is, the farther the capacitor plate senses, and then a non-contact capacitive sensing input can be achieved. However, the total area of the capacitor plate is fixed, in the case that the area of a single touch-positioning unit increases, the number of the touch-positioning units on the capacitor plate may decrease, and accordingly, a positioning accuracy of the capacitor plate is decreased.

If a new layer of capacitor plate(s) is added under the original capacitor plate, the two capacitor plates may not affect each other during performing capacitive sensing input. Moreover, the positioning accuracy of the non-contact input apparatus may be improved in the case that the two layers of the capacitor plates are staggeredly arranged.

A schematic diagram showing a mode for staggeredly distributing touch-positioning units of two capacitor plates provided in the disclosure may be referred to FIG. 15. In FIG. 15, the touch-positioning units 311, 312 and 313 are the touch-positioning units on an upper layer of capacitor plate(s); and the touch-positioning units 321, 322 and 323 are the touch-positioning units on a lower layer of capacitor plate(s). The touch-positioning units of the upper and lower layers of capacitor plate are staggered-distributed. As shown in FIG. 15, a midpoint of the touch-positioning unit 321 locates between the touch-positioning units 311 and 312, and the midpoint of the touch-positioning unit 322 locates between the touch-positioning units 312 and 313. According to a simple capacitive sensing approach, a position of a touch-positioning unit sensing a largest capacitance among the touch-positioning units is regarded as the position where a non-contact input is performed. In the case that there is only one layer of capacitor plate(s), a region shown in FIG. 3 only may be divided into 3 small touch regions, that is, only the non-contact input performed on the touch-positioning unit 311,312 or 313 can be sensed. In the case that two layers of capacitor plates are staggeredly arranged as shown in FIG. 15, if the non-contact input is performed between the touch-positioning units 311 and 312, the non-contact input may be sensed by the touch-positioning unit 321.

Therefore, the example of the non-contact input apparatus is applied to sense the non-contact operation, and the sensing accuracy of the position of the operation is improved.

A schematic diagram of a second example of the non-contact input apparatus provided in the disclosure may be referred to FIG. 16. Touch-positioning units on capacitor plates 401 and 402 are rectangular. Connection lines between the touch-positioning units on the capacitor plates are not shown in FIG. 4. In the example, a distribution of the touch-positioning units on the capacitor plate 401 is same as that of the touch-positioning units on the capacitor 402. The capacitor plate 401 locates above the capacitor 402 and is staggeredly arranged with respect to the capacitor plate 402. As shown in FIG. 4, the capacitor plate 401 is staggered, along an X direction, from the capacitor plate 402 with a first distance d1, and is staggered, along a Y direction, form the capacitor plate 402 with a second distance d2. The X direction is perpendicular to the Y direction. Usually, d1 equals to d2.

A schematic diagram of the capacitor plates in the second example of the non-contact input apparatus provided in the disclosure may be referred to FIG. 17. Connection lines between touch-positioning units on the capacitor plate 401 are shown in FIG. 17.

In practice, in the case that two layers of capacitor plates are staggeredly arranged, usually, the first distance is shorter than a length of one touch-positioning unit in a first direction, and the second distance is shorter than the length of one touch-positioning unit in a second direction.

A diagram showing lengths of a rectangular touch-positioning unit on one capacitor plate of the second example of the non-contact input apparatus provided in the disclosure may be referred to FIG. 18. In FIG. 18, the length of the touch-positioning unit in the first direction is L1, and the length of the touch-positioning unit in the second direction is L2. In this situation, the first distance d1, with which the second capacitor plate is staggered, in the first direction, from the first capacitor plate, may be shorter than L1, and the second distance d2, with which the first capacitor plate is staggered, in the second direction, from the first capacitor plate, may be shorter than L2.

A diagram showing lengths of a rhombic touch-positioning unit on one capacitor plate of the second example of the non-contact input apparatus provided in the disclosure may be referred to FIG. 19. In FIG. 19, the length of the touch-positioning unit in the first direction is L3, and the length of the touch-positioning unit in the second direction is L4. In this situation, the first distance d1, with which the first capacitor plate is staggered, in the first direction, from the first capacitor plate, may be shorter than L3, and the second distance d2, with which the first capacitor is staggered, in the second direction, from the first capacitor, may be shorter than L4.

A schematic diagram of the second example of the non-contact input apparatus provided in the disclosure may be referred to FIG. 20. As shown in FIG. 20, the apparatus at least includes capacitor plates 101 and 102. In FIG. 20, an isolation layer 103 is arranged between the capacitor plates 101 and 102 to prevent the capacitor plate 101 from contacting with the capacitor plate 102, and accordingly, the stability of the non-contact input apparatus provided in the disclosure is improved.

A schematic diagram of a third example of the non-contact input apparatus may be referred to FIG. 21. As shown in FIG. 21, the apparatus at least includes capacitor plates 101 and 102. In FIG. 9, a protection layer 104 is arranged above the capacitor plate 101 to prevent the capacitor plate 101 from being scratched by other objects.

A fourth example may be obtained based on the second and third examples of the non-contact input apparatus provided in the present application. A schematic diagram of the fourth example of the non-contact input apparatus provided in the disclosure may be referred to FIG. 22. As shown in FIG. 22, the apparatus at least includes capacitor plates 101 and 102. In FIG. 22, there is the protection layer 104 arranged above the capacitor plate 101, and an isolation layer 103 is provided between the capacitor plates 101 and 102.

A schematic diagram of a fifth example of the non-contact input apparatus provided in the disclosure may be referred to FIG. 23. As shown in FIG. 23, the apparatus further includes a capacitor plate 105, and there is a gap between the capacitor plates 105 and 102.

A distribution of touch-positioning units on the capacitor plate 105 is same as the distributions of touch-positioning units on the capacitor plates 101 and 102.

The capacitor plate 105 is staggered, in a first direction, from the capacitor plate 102 with a first distance, and the capacitor plate 105 is staggered, in a second direction, from the capacitor plate 102 with a second distance. The first direction is perpendicular to the second direction. Usually, the first distance equals to the second distance.

In this example, since the capacitor plate 105 is added and is staggeredly arranged with respect to the capacitor plate 102, the positioning accuracy of the non-contact input apparatus provided in the disclosure is further improved.

A schematic diagram of a sixth example of the non-contact input apparatus provided in the disclosure may be referred to FIG. 24. As shown in FIG. 24, the apparatus includes capacitor plates 101, 102 and 105. In FIG. 24, a protection layer 104 is arranged above the capacitor plate 101 to prevent the capacitor plate 101 from being scratched by other objects.

A schematic diagram of a seventh example of the non-contact input apparatus provided in the disclosure may be referred to FIG. 25. As shown in FIG. 25, the apparatus includes capacitor plates 101, 102 and 105. Isolation layers 103 are arranged both between the capacitor plates 101 and 102 and between the capacitor plates 102 and 105 to prevent neighboring capacitor plates from contacting with each other, and accordingly, the stability of the non-contact input apparatus provided in the disclosure is improved.

A schematic diagram of an eighth embodiment of the non-contact input apparatus provided in the disclosure may be referred to FIG. 26. As shown in FIG. 26, the apparatus includes capacitor plates 101, 102 and 105. Isolation layers 103 are arranged both between the capacitor plates 101 and 102 and between the capacitor plates 102 and 105. A protection layer 104 is arranged above the capacitor plate 101.

It can be seen that, for the non-contact input apparatus provided in the disclosure, the more the staggeredly arranged capacitor plates are, the more precise a positioning performance is. In addition, the isolation layers may be arranged between any two neighboring layers of capacitor plates, the protection layer may be arranged above an outermost layer of capacitor plate(s).

An electronic device is provided in the disclosure. The electronic device includes the non-contact input apparatus provided in the disclosure.

It should be noted that, the embodiments in the specification are described progressively. Differences between the embodiments are highlighted, while the same or similar parts between the embodiments may be referred to each other. Since apparatus embodiments are similar with method embodiments, description of the apparatus embodiments is simple and may be referred to the description of the method embodiments.

It should further be noted that, terms of "first", "second", etc., used in the specification are intended to distinguish an entity or operation from another entity or operation, rather than to require or hint that a real relationship or order exists between the entities or operations. In addition, terms of "include", "comprise" and any transformation thereof are intended to be non-exclusive; procedures, methods, items or devices including a series of elements are not limited to the elements, and inherent elements or elements which are not clearly listed may further be included in the procedures, methods, items or devices. Without more limitations, if an element is restricted with an expression of "include(s) a . . . ", the procedures, methods, items or devices including the element may include other similar elements.

For convenient description, the apparatus is divided into various units based on functions and the various units are described respectively. Of course, the functions of the units may be implemented in one or more softwares and/or hardwares.

It can be seen from the description of the above embodiments that, it should be understood clearly by those skilled in the art that the disclosure may be implemented with software and a necessary common hardware platform. Accordingly, the essence of the technical solutions of the disclosure, or parts of the technical solutions of the disclosure contributing to the existing technologies may be embodied in the form of a software product. The software product may be stored in a storage medium such as ROM/RAM, disk and optical disk, etc. The software product includes multiple instructions which enable a computer device (such as PC, server, network device or the like) to execute the methods described in embodiments of the disclosure or described in parts of the embodiments of the disclosure.

The method for adjusting the intensity of the electric field and the system thereof provided in the disclosure are described in detail. The principle and embodiments of the disclosure are described with specific examples. The description of the above embodiments is only used to help in understanding the methods and core concepts of the disclosure. Changes may be made to the embodiments and the application range based on the concepts of the disclosure by those skilled in the art. Accordingly, the specification is not intended to limit the disclosure.

The invention claimed is:

1. A method for adjusting an intensity of an electric field, comprising:
    detecting whether a capacitance of a sensing capacitor generated by a group of capacitor plates reaches a preset threshold;
    changing a relative position or connection of the capacitor plates in the group of capacitor plates, in the case that the capacitance of the sensing capacitor reaches a preset threshold; and
    adjusting the intensity of the electric field generated by the group of capacitor plates,
    wherein the detecting whether the capacitance of the sensing capacitor generated by the group of capacitor plates reaches the preset threshold comprises:
    determining a vector direction in which a detection object locates with respect to the group of capacitor plates; and
    in the case that the detection object is beyond coverage of the sensing capacitor generated in the vector direction by the group of capacitor plates, judging that the capacitance of the sensing capacitor generated by the group of capacitor plates reaches the preset threshold.

2. The method according to claim 1, wherein the changing the relative position of the capacitor plates in the group of capacitor plates comprises:
    changing a whole shape of the group of capacitor plates to make the group of capacitor plates form a curvature in the vector direction.

3. The method according to claim 1, wherein before the method is performed, the method further comprises:
    pre-arranging at least two groups of capacitor plates, wherein maximum capacitances of the sensing capacitors generated by the at least two groups of capacitor plates are different from each other.

4. The method according to claim 3, further comprising:
    in the case that it is detected that the capacitance of the sensing capacitor generated by a current group of capacitor plates with respect to the detection object reaches the preset threshold, switching from the current group of capacitor plates to a first group of capacitor plates, wherein the maximum capacitance of the sensing capacitor generated by the first group of capacitor plates is larger than the maximum capacitance of the sensing capacitor generated by the current group of capacitor plates.

5. The method according to claim 1, wherein the changing the connection between the capacitor plates in the group of capacitor plates comprises:
    selecting at least two capacitor plates from the group of capacitor plates; and
    correlating the selected at least two capacitor plates to form a second group of capacitor plates;
    wherein the detection object is within the coverage of the sensing capacitor generated in the vector direction by the second group of capacitor plates.

6. A system for adjusting an intensity of an electric field, comprising:
    a detection unit, adapted to detect whether a capacitance of a sensing capacitor generated by a group of capacitor plates reaches a preset threshold; and
    an adjustment unit, adapted to, in the case that the detection unit detects that the capacitance of the sensing capacitor generated by the group of capacitor plates reaches the preset threshold, change a relative position or connection of capacitor plates in the group of capacitor plates, to adjust the intensity of the electric field generated by the group of capacitor plates,
    wherein the detection unit comprises:
    a determination sub-unit, adapted to determine a vector direction in which a detection object locates with respect to the group of capacitor plates; and
    a judgment sub-unit, adapted to, in the case that the detection object is beyond coverage of the sensing capacitor generated in the vector direction by the group of capacitor plates, judge that the capacitance of the sensing capacitor generated by the group of capacitor plates reaches the preset threshold.

7. The system according to claim 6, wherein the adjustment unit comprises:
 a first adjustment sub-unit, adapted to change a whole shape of the group of capacitor plates to make the group of capacitor plates form a curvature in the vector direction.

8. The system according to claim 6, wherein the adjusting unit comprises:
 a second adjustment sub-unit, adapted to select at least two capacitor plates from the group of capacitor plates and correlate the selected at least two capacitor plates to form a second group of capacitor plates, wherein the detection object is within the coverage of the sensing capacitor generated in the vector direction by the second group of capacitor plates.

9. The system according to claim 6, wherein the capacitor plates are arranged in two layers with a gap between the two layers of capacitor plates; each layer of the two layers of capacitor plates comprises a plurality of touch-positioning units; and the touch-positioning units on one layer of capacitor plate are distributed staggeredly with respect to the touch-positioning units on the other layer of capacitor plate.

10. The system according to claim 6, wherein the touch-positioning units on one layer of capacitor plate are distributed staggeredly with respect to the touch-positioning units on the other layer of capacitor plate in a way that:
 one layer in the two layers of capacitor plates comprises a first capacitor plate and the other layer comprises a second capacitor plate;
 a distribution of the touch-positioning units on the first capacitor plate is same as the distribution of the touch-positioning units on the second capacitor plate; and
 the second capacitor plate is staggered, in a first direction, from the first capacitor plate with a first distance, and is staggered, in a second direction, from the first capacitor plate with a second distance, wherein the first direction is perpendicular to the second direction.

11. The system according to claim 10, wherein the first distance equals to the second distance.

12. The system according to claim 10, wherein the first distance is shorter than a length of one touch-positioning unit in the first direction, and the second distance is shorter than a length of one touch-positioning unit in the second direction.

13. The system according to claim 12, wherein the touch-positioning units are rhombic or rectangular.

14. The system according to claim 12, wherein an isolation layer is arranged between the two layers of capacitor plates.

15. The system according to claim 12, wherein a protection layer is arranged above the two layers of capacitor plates.

16. The system according to claim 10, wherein the capacitor plates further comprise a third capacitor plate, and there is a gap between the third capacitor plate and the second capacitor plate;
 a distribution of the touch-positioning units on the third capacitor plate is same as the distribution of the touch-positioning units on the first capacitor plate and the distribution of the touch-positioning units on the second capacitor plate; and
 the third capacitor plate is staggered, in the first direction, from the second capacitor plate with the first distance, and the third capacitor plate is staggered, in the second direction, from the second capacitor plate with the second distance, wherein the first direction is perpendicular to the second direction.

17. The system according to claim 16, wherein the first distance equals to the second distance.

* * * * *